United States Patent [19]

Greenwood et al.

[11] Patent Number: 5,135,317
[45] Date of Patent: Aug. 4, 1992

[54] STATIONARY PRINTHEAD WITH MOVING PLATEN

[75] Inventors: Peter J. Greenwood, Danbury, Conn.; Stephen J. Kish, Hyde Park, N.Y.; Julius J. Lambright, Hopewell Junction, N.Y.; Arthur Luneau, Carmel, N.Y.

[73] Assignee: International Business Machines Corporation, Armonk, N.Y.

[21] Appl. No.: 754,830

[22] Filed: Sep. 4, 1991

[51] Int. Cl.$^5$ .................. B41J 02/315; B41J 19/68; B41F 17/24
[52] U.S. Cl. ...................... 400/120; 101/35; 271/197; 198/689.1; 198/811; 400/29
[58] Field of Search .............. 101/35; 400/120, 23, 400/29; 356/394; 198/689.1, 721, 811; 271/197, 276

[56] References Cited

U.S. PATENT DOCUMENTS

| | | | |
|---|---|---|---|
| 3,537,393 | 11/1970 | Hegi | 101/235 |
| 3,638,564 | 2/1972 | Prange et al. | 101/35 |
| 3,659,521 | 5/1972 | Lany | 101/35 |
| 3,889,801 | 6/1975 | Boyer | 198/811 |
| 3,913,719 | 10/1975 | Frey | 400/29 |
| 3,995,730 | 12/1976 | Kwan et al. | 197/127 R |
| 4,278,018 | 7/1981 | Johannesson | 101/93 |
| 4,438,698 | 3/1984 | Sullivan et al. | 101/287 |
| 4,572,687 | 2/1986 | Croley et al. | 400/120 |

OTHER PUBLICATIONS

IBM Technical Disclosure Bulletin vol. 31, No. 4, Sep. 1988, "Thermal Printing Station Using Stationary Printhead and Moving Platen".

Primary Examiner—Edgar S. Burr
Assistant Examiner—Stephen R. Funk
Attorney, Agent, or Firm—Harold Huberfeld

[57] ABSTRACT

Accordingly, an apparatus has been provided for printing identifying indicia on a work product. The apparatus includes a print mechanism and a transport for imparting relative motion between the work product and the print mechanism. The work product and the print mechanism are positioned in close proximity to one another. A control is provided for causing the print mechanism to print predetermined identifying information on the work product when the work product and the print mechanism reach a desired location as they move with respect to each other. In the preferred embodiment the print mechanism has a fixed print electrode with a moving resistive ribbon associated therewith. A track is provided for supporting the work product on air bearings. A moving vacuum belt moves the work product along the track and thereby moves the work product with respect to both the print electrode and the ribbon.

9 Claims, 3 Drawing Sheets

STATIONARY PRINTHEAD WITH MOVING PLATEN

BACKGROUND OF THE INVENTION

1. Field of the Invention

This invention relates generally to an apparatus for printing identifying indicia on a work product and more particularly to such an apparatus for printing on-the-fly during an inspection or manufacturing process.

2. Related Art

In the manufacture of glass ceramic substrates for electronic circuits a large number of greensheets are stacked to form a laminate and baked in a sintering surface to form a ceramic brick. The individual greensheets are unfired ceramic sheets containing a large number of via holes and in their unfired state are flexible. Via holes are designed to have their walls coated with copper thereby forming vias or electrical conductors between two or more circuit levels. Before stacking the individual greensheets to form a laminate it is desirable to inspect each sheet for defects. An apparatus suitable for conducting such an inspection is described in co-pending patent applications Ser. Nos. 07/754,793 and 07/754,794 filed concurrently herewith and assigned to the assignee of the present invention. As part of the inspection process it is helpful to place identifying indicia on each greensheet being inspected so that sheets which must be discarded or repaired as a result of the inspection process may be readily identified by the operator. Heretofore, impact type printers have been utilized to print multiple character indicia in a single motion on a fixed greensheet. This method suffers from two disadvantages. Firstly, such impact printers use inked ribbons which are subject to loss of ink or deterioration over time resulting in degradation of print quality. Secondly, this technique creates a risk of damage to the greensheets surface due to the printing impact force.

SUMMARY OF THE INVENTION

An object of the present invention is the provision of an apparatus for printing identifying indicia on a moving work product without stopping or slowing the movement of the work product.

Another object of the present invention is the provision of an apparatus for printing identifying indicia on a moving work product without damaging the surface of the work product.

A further object of the present invention is the provision of an apparatus for printing consistently high quality identifying indicia on a moving work product.

Yet another object of the present invention is the provision of an apparatus for printing identifying indicia on a moving work product which is relatively simple in construction and inexpensive to manufacture.

Accordingly, an apparatus has been provided for printing identifying indicia on a work product which includes a print mechanism and means for imparting relative motion between the work product and the print mechanism. The work product and the print mechanism are positioned in close proximity to one another. A control is provided for causing the print mechanism to print predetermined identifying information on the work product when the work product and the print mechanism reach a desired location as they move with respect to each other. In the preferred embodiment the print mechanism has a fixed print electrode with a moving resistive ribbon associated therewith. A track is provided for supporting the work product on air bearings. A moving vacuum belt moves the work product along the track and thereby moves the work product with respect to both the print electrode and the ribbon.

Other objects, advantages, and novel features of the present invention will become apparent from the following detailed description of the invention when considered in conjunction with the accompanying drawings.

DESCRIPTION OF THE PREFERRED EMBODIMENT

Figure 1:
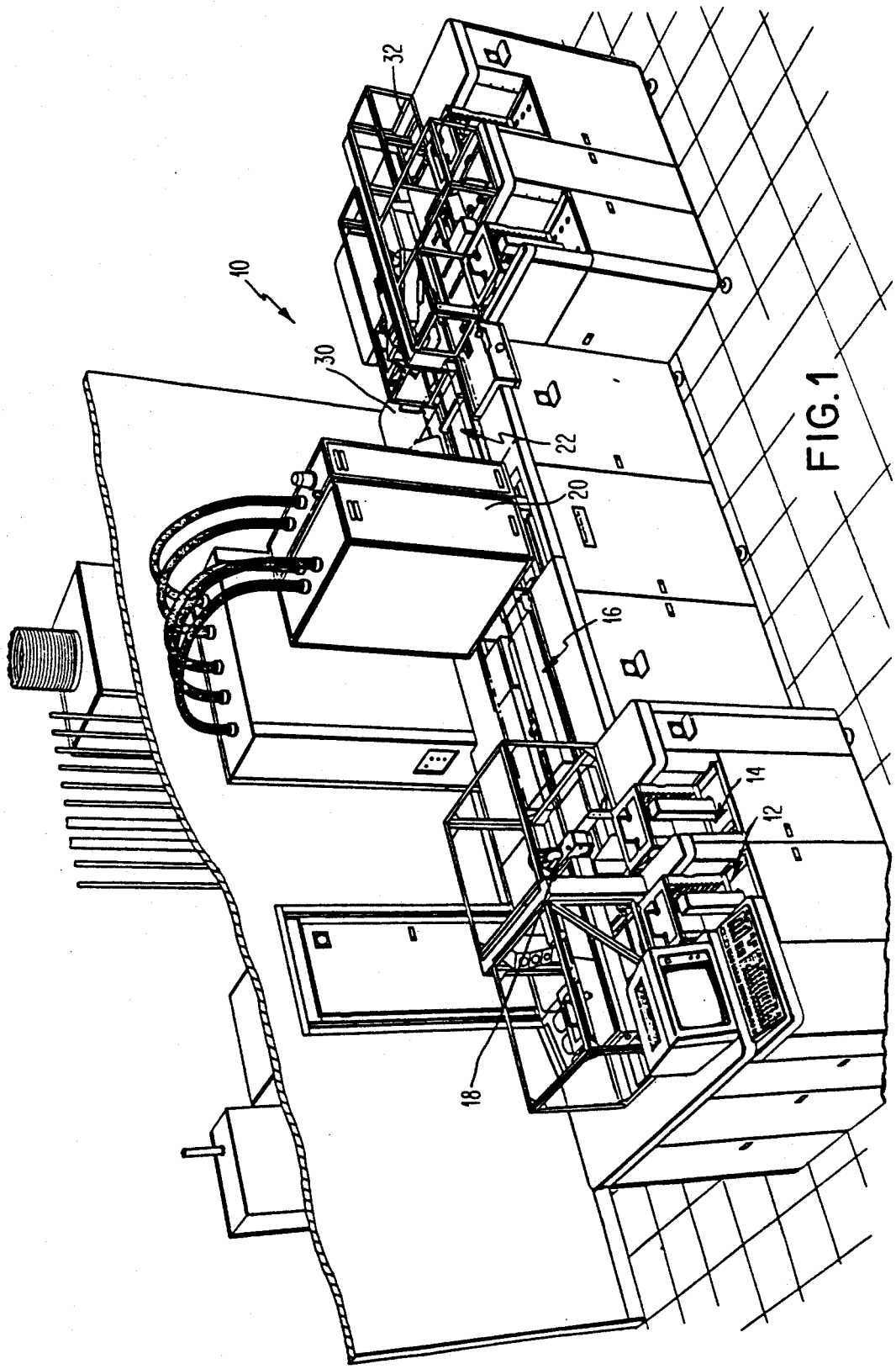
FIG. 1 shows a perspective view of an inspection apparatus on which the apparatus of the present invention may be used.

FIG. 1 shows an inspection apparatus 10 on which the printing apparatus of the present invention may be used. The inspection apparatus 10 is utilized to inspect greensheet vias for possible defects and is more particularly described in application Ser. No. 07/754,794, filed concurrently herewith and assigned to the assignee of the present invention. Generally the apparatus 10 includes a pair of magazines 12 and 14 into which the greensheets are loaded. The magazines may hold up to 10 trays each with up to 20 sheets each on each tray. A pick and place tool removes individual greensheets from one of the magazines 12 or 14 and places them on a track 16 which supports the sheets on air bearings. The sheets are delivered along the track 16 through a cleaning station 18 and registered into an inspection station 20. When the inspection has been completed a sheet passes onto an output track 22 also supported by air bearings past the printing apparatus 30 of the present invention, where identifying indicia are printed on the sheet as it is transported past the printer 30 on track 22. The sheets are then delivered to an output station 32 where they are sorted in accord with the results of the inspection process.

Figure 2:
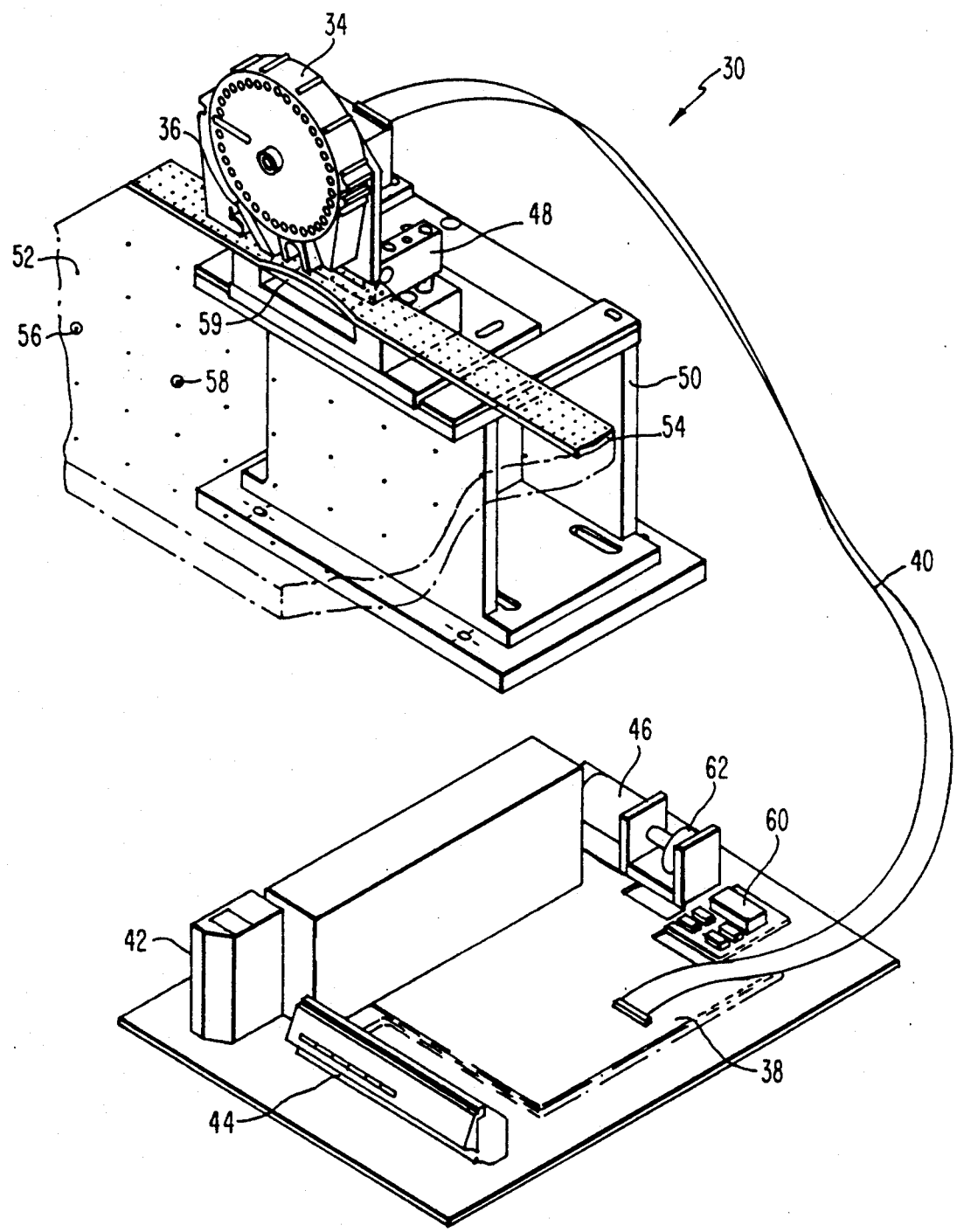
FIG. 2 shows a perspective view in partial breakaway form of the printing apparatus of the present invention.

FIG. 2 shows the printing apparatus 30 of the present invention in greater detail. The print mechanism 30 is utilized to print identifying indicia on a work product, in this case greensheets, as they travel past the apparatus 30 on track 22. The print mechanism includes a printer ribbon 34 and a print electrode 36. The ribbon 34 and electrode 36 are connected to a control circuit board 38 by a flat flexible multi-conductor ribbon type cable 40. Also connected to the control circuit board 38 are a power supply 42, a display panel 44, and a carrier drive motor 46. With only minor modification, as will be discussed further herein, the ribbon 34, the print electrode 36, the control board 38, the cable 40, the power supply 42, the display panel 44, and the carrier drive motor 46 are known components of a paper printer apparatus heretofore and presently being sold by International Business Machines Corporation under the Trademark QUIETWRITER ® III. The printer ribbon 34 and print electrode 36 are mounted on a support 48 in such a fashion that they are suspended over the transport track 22. The support 48 is in turn fastened to and supported by a support 50 which is fastened to the frame of the inspection apparatus 10. Air bearings 52 on transport track 22 support the greensheets thereon so that they may be transported by a vacuum belt 54 of known construction. The belt 54 moves at a relative velocity of 16 inches per second or greater with respect tot he track 22 and the print electrode 36. The ribbon 34 is a resistive type ribbon and is interposed between the print electrode 36 and the work product. The ribbon 34 comes into contact with the work product but the electrode 36 serves to cause the ribbon to print on the surface of the work product while applying substantially zero force to the surface of the work product. Thus there is virtually no risk that the printing apparatus of the present invention will damage the surface of the work product in any way.

A pair of optical position sensors 56 and 58 are embedded in the transport track 22. Only one of the sensors 56 or 58 is active at any point in time. On an initial printing cycle the sensor 56 will be active and will sense when the work product has reached a predetermined position on the track 22 and generate a signal indicative thereof. The sensors 56 and 58 are optical position sensors of a known type which generate an optical signal which is reflected off the work piece and received by the sensor, thereby indicating the presence of the work product. When such a signal is received as soon as the edge of a greensheet passes over the sensor 56 the sensor 56 sends a signal to the control board 38 to start a printing sequence. The particular indicia to be printed on the greensheet is determined by the control program for the inspection apparatus 10. The sensor 58 is activated and the sensor 56 is deactivated in order to print indicia in a different location on the greensheet on a subsequent inspection to check for repairs that have been made to areas on the greensheet which failed to pass an initial inspection. The print electrode 36, as has been previously mentioned, was designed to operate with a printer platen which is cylindrical in shape, and accordingly a curved element 59 is inserted under the vacuum belt 54 directly beneath the area on the ribbon where the print electrode will contact the ribbon. The greensheets are thin enough to be relatively flexible and thus will conform to the curved surface presented by the element 59 and be curved upward toward the print electrode 36. This adaptation has the effect of assuring high print quality. It is of course understood that if the print electrode 36 were designed to print on a flat surface this adaptation would not be necessary. In addition the cable 40 has been considerably lengthened from that provided with the aforementioned printer to be approximately eight feet long to allow the control circuit 38 to be located at a point in the apparatus 10 considerably remote from the ribbon and print electrode.

As has previously been mentioned for reasons of economy the printing apparatus of the present invention was adapted from the commercially available printing apparatus on the International Business Machines QUIETWRITER ® III printer. In that type of printer when power to the printer is turned on, the drive motor is utilized to drive the print electrode and ribbon assembly across the platen to the left until it reaches a hard mechanical stop. This causes an encoder in the printer to assume a zero state thereby initializing the printer. The drive motor then reverses direction and drives the printhead to the center of the platen. As is common in this art this is a ready position for print commands. When a print command is executed, the drive motor drives the printhead to the left margin of the page on which the command is to be executed. Since the print electrode 36 and ribbon 34 of the present invention are stationary it was recognized that a mechanism is required to enable the control circuit of the present invention to be used with such a stationary print assembly. Accordingly the apparatus of the present invention includes an electro-mechanical means for simulating a mechanical stop as described above. Thus the present invention utilizes a brake control circuit 60 for controlling a combination brake and clutch assembly 62 in response to control signals from the circuit 60. The brake and clutch assembly 62 serve to brake and release the electric motor 46. The brake and clutch 62 is responsive to a voltage signal from the brake control circuit 60 to cause the unit 62 to apply its brake to the motor 46. When that voltage signal is absent the motor 46 is permitted to spin freely. Thus generally in the operation of the brake control circuit of the present invention the circuit permits the motor 46 to spin freely when a cycle is started, then stops the motor simulating a hard stop on the printer, and finally releases the motor to a free moving state for the remainder of the operation cycle. In effect this operation simulates a platen of infinite length.

Figure 3:
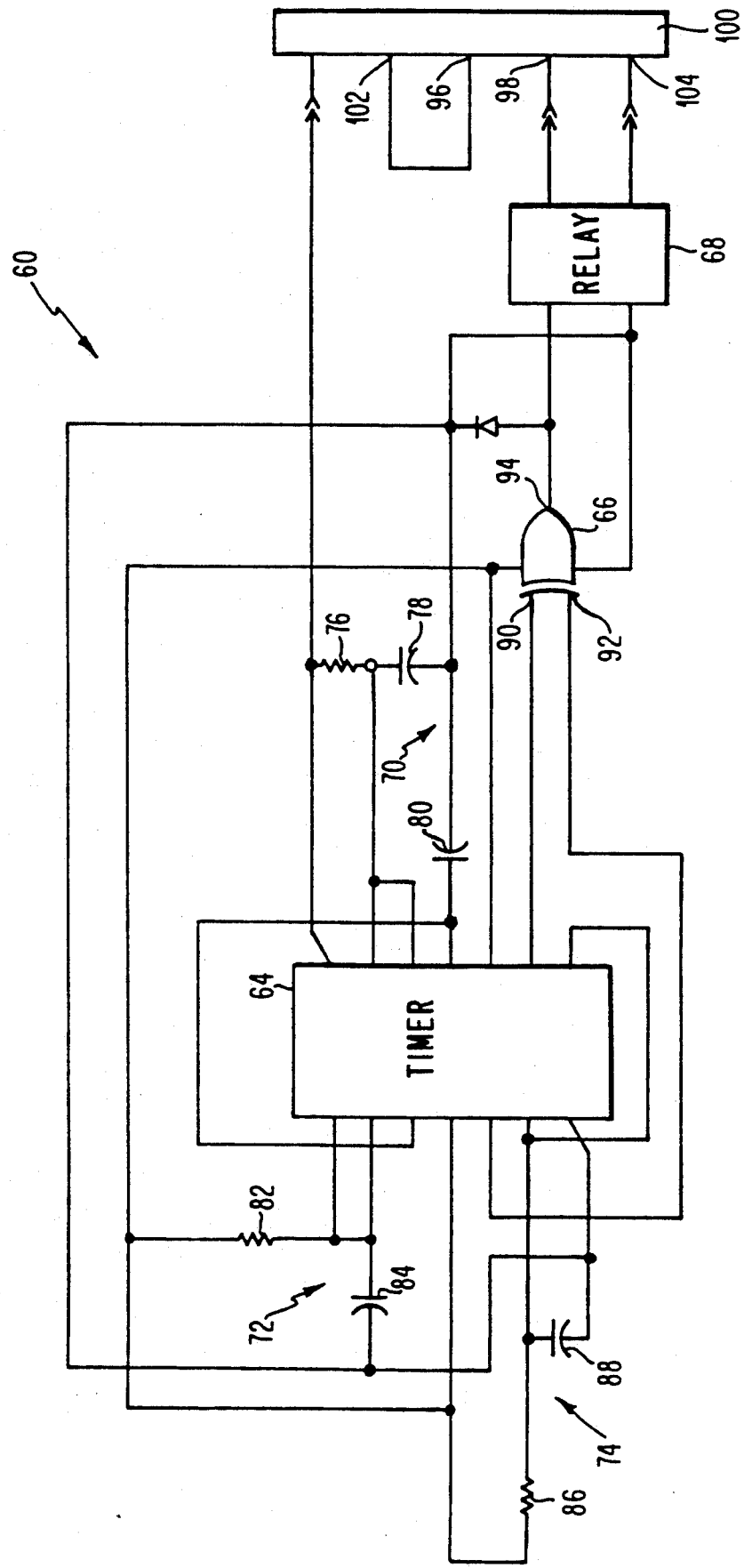
FIG. 3 shows a schematic diagram of a brake control circuit utilized with the printing apparatus of the present invention.

FIG. 3 shows the brake control circuit 60 in schematic form. The circuit includes a standard Model No. 556 timer module 64, a standard Model No. 7486 exclusive OR gate 66 and a relay 68. This circuit further includes RC timing circuits 70, 72 and 74. The circuit 70 includes a 200K ohm resistor 76, a 5 microfarad capacitor 78 and a 0.01 microfarad capacitor 80. The circuit 72 includes a 240K ohm resistor 82 and a 5 microfarad capacitor 84. The circuit 74 includes a 220K ohm resistor 86 and a 5 microfarad capacitor 88. The RC timing circuits 70, 72 and 74 are designed to create 30 millisecond timing delays between operations. Accordingly the circuit 60 operates when power is turned on to send two high signals to input terminals 90 and 92 of exclusive OR gate 66 causing the output 94 of gate 66 to assume a low state. This in turn causes the relay 68 to release the brake and clutch 62 thereby permitting the motor 46 to spin freely. The brake and clutch 62 is connected across terminals 96 and 98 on terminal board 100. Terminal 102 is connected to a 30 Volt supply for the brake and clutch 62 and terminal 104 returns the brake and clutch 62 to the 30 Volt supply through the relay 68.

After a delay of 30 milliseconds the timing module 64 sends one high signal and one low signal to terminals 90 and 92. This causes the output of gate 66 to go high closing the relay 68 and energizing the brake and clutch 62 thus preventing the motor from spinning. After an additional delay of 30 milliseconds the timing circuit 64 sends a pair of low signals to terminals 90 and 92 causing the output 94 of gate 66 to again assume a low state releasing the brake clutch 62 and permitting the motor 46 to again spin freely for the remainder of the operation.

One additional modification has been made to the standard printer circuit for the QUIETWRITER ® III printer. The circuit includes a paper sensor which prevents the printer from printing if paper is not present on the platen. Since of course in the present operation there is no paper this feature has been modified by creating a discontinuity disengaging this feature from the circuit.

Thus an apparatus has been provided for printing identifying indicia on a moving work product which is both simple in construction and relatively inexpensive to manufacture. The apparatus prints with high quality, does not in any way slow throughput through the system and creates virtually no risk of damage to the surface of the work product.

While there has been described what is at present considered to be the preferred embodiment of the present invention, it will be obvious to those skilled in the art that various changes or modifications may be made therein, without departing from the invention, and it is, therefore, aimed in the appended claims to cover all those changes and modifications as follow in the true spirit and scope of the invention.

What is claimed is:

1. An apparatus for printing identifying indicia on a work product comprising:
    a print mechanism,
    means for imparting relative motion between said work product and said print mechanism and positioning said work product and said print mechanism in close proximity to each other,
    control means for causing said print mechanism to print predetermined identifying information on said work product when said work product and said print mechanism reach a desired location as they move with respect to each other and
    electromechanical means for enabling said control means to cause said print mechanism to commence printing, said electro-mechanical means including a control circuit for generating a plurality of control signals, an electric motor, and a combination brake and clutch for applying a brake to said motor in response to a control signal from said control circuit thereby initializing the printer.

2. The apparatus of claim 1 wherein said control circuit includes a timer, an exclusive OR circuit, and a relay; and wherein said timer operates in a first mode to send two high signals to said exclusive OR circuit, thereby causing said relay to disengage said clutch and free said motor to turn; wherein said timer operates in a second mode to send a high and a low signal to said exclusive OR circuit, thereby causing said relay to engage said clutch and said brake to prevent said motor from turning; and wherein said timer operates in a third mode to send two low signals to said exclusive OR circuit, thereby causing said relay to disengage said clutch and freeing said motor to turn.

3. An apparatus for printing identifying indicia on a work product comprising:
    transport means including a track having a plurality of air bearings for directly supporting said work product on said track and including a vacuum belt adapted to move with respect to said track for moving said work product along said track;
    a print mechanism mounted in a fixed relationship with respect to said track; and
    control means for causing said print mechanism to print predetermined identifying information on said work product as said work product reaches a desired location during the movement of said work product with respect to said print mechanism.

4. The apparatus of claim 3 further including said work product and wherein said work product is individual layers of an electronic substrate.

5. The apparatus of claim 3 further including means for sensing when said work product has reached a predetermined position on said track.

6. The apparatus of claim 5 wherein said sensing means includes a sensor mounted on said track.

7. The apparatus of claim 6 wherein said sensor is an optical sensor.

8. The apparatus of claim 3 wherein said track includes a portion under said vacuum belt and said print mechanism which is curved upward toward said print mechanism, thereby bending said work product as it passes over said curved portion to present said print mechanism with a curved printing surface.

9. The apparatus of claim 3 wherein said vacuum belt moves said work product at a relative velocity of at least sixteen inches per second with respect to said track.

* * * * *